United States Patent [19]
Ohsawa

[11] Patent Number: 5,407,181
[45] Date of Patent: Apr. 18, 1995

[54] VERTICAL HEAT TREATING DEVICE

[75] Inventor: Tetsu Ohsawa, Sagamihara, Japan

[73] Assignees: Tokyo Electron Kabushiki Kaisha, Tokyo; Tokyo Electron Tohoku Kabushiki Kaisha, Iwate, both of Japan

[21] Appl. No.: 157,280

[22] Filed: Nov. 26, 1993

[30] Foreign Application Priority Data

Nov. 26, 1992 [JP] Japan .................................. 4-341509

[51] Int. Cl.⁶ ............................................... F27D 3/06
[52] U.S. Cl. ..................................... 266/257; 432/241
[58] Field of Search ...................... 266/252, 257, 249; 432/5, 241

[56] References Cited

U.S. PATENT DOCUMENTS 4,770,590  9/1988  Hugues et al. ........................ 414/172
5,055,036  10/1991 Asano et al. ............................ 432/5
5,236,181  8/1993  Ishii et al. ............................. 266/252

OTHER PUBLICATIONS

English Language Abstract of Japanese Laid-Open Patent Publication No. 63-314843 dated Dec. 22, 1988.

Primary Examiner—Scott Kastler
Attorney, Agent, or Firm—Beveridge, DeGrandi, Weilacher & Young

[57] ABSTRACT

This invention relates to a vertical heat treating device of a two-boat system including below a vertical reaction furnace a first waiting position where a treated boat waits, and second waiting position where a boat to be next treated waits. The device comprises boat transferring device for transfer wafers at the first and the second waiting positions and at the vertical reaction furnace. The boat transferring device can be displaced in a two-dimensional plane at least including rotation and radial displacement from the rotation center. A heat shielding member is also provided for hindering thermal influence between the first and the second waiting positions so that the first and the second waiting positions can be positioned as near each other as possible to minimize a space occupied by the boat transferring device, whereby the vertical heat treating device can be made smaller-sized.

9 Claims, 10 Drawing Sheets

VERTICAL HEAT TREATING DEVICE

BACKGROUND OF THE INVENTION

This invention relates to a vertical heat treating device, especially to a boat loader for use in vertical heat treating devices for diffusion, oxidation, annealing and film forming treatment.

In general, a boat (the so-called wafer boat) for batch-treating a plurality of objects to be treated, such as semiconductor wafers, in heat treatment steps is provided in, e.g., a vertical reaction furnace, in a treatment chamber of a vertical heat treating device, and a boat loader for loading and unloading the boat into and out of the reaction furnace is provided.

Some requirements of the boat for the batch treatment of the objects to be treated are not only that the boat can mount a number of objects to be treated, but also that a procedure for loading the boat into the reaction furnace is efficient to improve the so-called throughputs of the heat treating device.

To this end, it is proposed that a boat with a next set of objects to be treated mounted thereon stands by to be loaded into the reaction furnace while the heat treatment is going on objects-to-be-treated mounted on another boat, and when the heat treatment is over, the latter boat is immediately replaced by the former boat to continuously conduct the heat treatment on the objects to be treated on the loaded boat. This structure is called a two boat system which includes in the treatment chamber a place where a boat to be next treated waits, and a place where a heat-treated boat unloaded from the reaction furnace waits.

One of the boat loaders which use the two-boat system includes boat mounts provided on both ends of a rotary arm, and the mounts are rotated by 180° between a lower position of a boat elevator and a position where a boat with objects-to-be-treated mounted thereon for a next heat treatment waits, whereby the boats are loaded into the reaction furnace (See e.g., Japanese Patent Laid-Open Publication No. 291335/1986). Another boat loader includes a swingable cantilever arm instead of the boat mounts on both ends of the arm as described above, whereby the arm is swung between a new boat loading position and a position where the treated boat waits, and the treated objects on the boat unloaded out of the reaction furnace are transferred on a swing path (See e.g., Japanese Patent Application No. 82521/1990, which is one of the applications of the applicant of the present application).

But the above-described boat loader needs a set rotation radius of the arm, and the arm tends to occupy a large space in the treatment chamber. Accordingly problems are encountered in that the vertical heat treating device cannot be smaller-sized, and its structure is complicated.

That is, in terms of sizes of the heat treating device, a suitable gap is necessary for preventing thermal interference between a heat treated boat and a boat to be mounted on the boat elevator for a next heat treatment. There is a possibility that the arm will need a considerably large radius, and the arm adversely occupies a large space in the heat treating device.

These are obstructions when it is considered that vertical heat treating devices of this type are expected to have higher throughputs, and to this end, there is a tendency to include a larger number of reactors per an area in a clean room, whose cost per unit area is on the increase.

In terms of structures of the heat treating device, the structures have been increasingly complicated. One reason for that is the arm of a set rotation radius has an operation which does not interfere with the carrier or the boat elevator while the arm is being moved to the respective waiting positions of the boats. Another reason is that for the transfer of a boat, or the objects to be treated, the wafers, on the boat, one unit has to include shafts for rotating and lifting the boats, or the objects to be treated. In addition, to position the arm at the respective waiting positions, based on a rotation radius and a rotation angle of the arm, an allowance of the arm with respect to the lower end plate of the boats in which the arm is inserted is as small as, e.g., 0.2–0.3 mm. On the other hand, the allowance of the rotation radius or the rotation angle is not permitted to be larger, i.e., the so-called teaching of the arm for the positioning in consideration of a radius error or an angle error must be very accurate. Accordingly the teaching processing is very difficult. In addition, as the structure is complicated, more dust is generated in respective mechanisms, and the risk that the dust might stick to the wafer surfaces on the boats is higher.

The dust tends to be influenced by turbulences of air flow in the treatment chamber due to heat from the reaction furnace, and it is necessary that the influence by the turbulences of air flow be removed, and even when the turbulences occur, dust must be suppressed from sticking to the surfaces of the objects to be treated at the waiting positions.

SUMMARY OF THE INVENTION

In view of the above-described problem, especially the problem involved in the boat loader of the conventional vertical heat treating device, this invention aims at providing a vertical heat treating device of a structure which can reduce a space for the boat loader as much as possible to down-size the heat treating device.

An object of this invention is to suppress the influence of turbulences of air flows in the treatment chamber due to heat from the reaction furnace for preventing dust from sticking to the surfaces of wafers.

Another object of this invention is to provide a vertical heat treating device having a structure which can simplify a drive mechanism for a combination of boat transfer means and wafer transfer means.

To achieve the objects of this invention, this invention provides a vertical heat treating device of a two-boat system including below a vertical reaction furnace, a first waiting position where a treated boat waits, and a second waiting position where a boat to be next treated waits, the device comprising one boat transferring means which can be displaced to the first and the second waiting position, and a boat loading/unloading position in and from the reaction furnace, the boat transferring means being displaceable in a two-dimensional plane containing at least rotation and radial displacement from a rotation center of the rotation.

According to this invention, the boat transferring means can be displaced in a direction normal to the two-dimensional plane in addition to the displacements in the two-dimensional plane.

This invention relates to a vertical heat treating device of a two-boat system including, below a vertical reaction furnace, a first waiting position where a treated boat waits, and a second waiting position where a boat to be next treated waits, the device comprising one boat transferring means which can be displaced to the first and the second waiting position, and a boat loading/unloading position in and from the reaction furnace, the first and the second waiting positions being provided upstream of flow of clean air or purge gas, the boat transferring means being disposed downstream of the first and the second waiting positions.

In the vertical heat treating device according to this invention, the first waiting position is provided nearer to the boat loading/unloading position than the second waiting position, and a heat shielding body is disposed between the first and the second waiting positions.

This invention provides a vertical heat treating device of a two-boat system including, below a vertical reaction furnace, a first waiting position where a treated boat waits, and a second waiting position where a boat to be next treated waits, the device comprising one boat transferring means which can be displaced to the first and the second waiting position, and a boat loading/unloading position in and from the reaction furnace, and object-to-be-treated transferring means for mounting and dismounting objects to be treated on and from the boats, respective lift drives for the boat transferring means and the object-to-be-treated transferring means being disposed coaxially with each other and being driven independently from each other.

As described above, according to this invention, displacement directions of the boat transferring means are set at a rotary direction and a radial direction from the rotation center, whereby the boat transferring means can be displaced between the boat waiting positions by swing, and radial extension and withdrawal of the boat transferring means. Accordingly spaces for the transfer of the boats and sizes of the device can be decreased. When the boat waiting positions are made nearer, it is possible to provide a heat shielding structure for the hindrance of thermal influence between the boat waiting positions. It is also possible to operate the boat transferring operation without interference with the heat shielding structure.

Since the boat transferring means can be displaced in a two-dimensional plane, a displacement position can be suitably selected in the two-dimensional plane. Accordingly a position with an allowance of a radial error and an angular error can be indexed, which makes teaching of positioning the boat waiting positions easy.

The boat waiting positions are set upstream of flow of the purge gas or clean air, and the boat transferring means is disposed behind the boat waiting positions, whereby dust generated from the boat transferring means can be recovered before arriving at the surfaces of objects to be treated.

The lift drive for the boat transferring means and the object-to-be-treated transferring means are disposed coaxially with each other. Accordingly a common drive shaft can accommodate both drives without the necessity of an additional drive shaft in a single unit, and the common use of one drive shaft can make the structure simple.

DETAILED DESCRIPTION OF THE INVENTION

This invention will be explained in good detail with reference to the drawings attached hereto.

Figure 1:
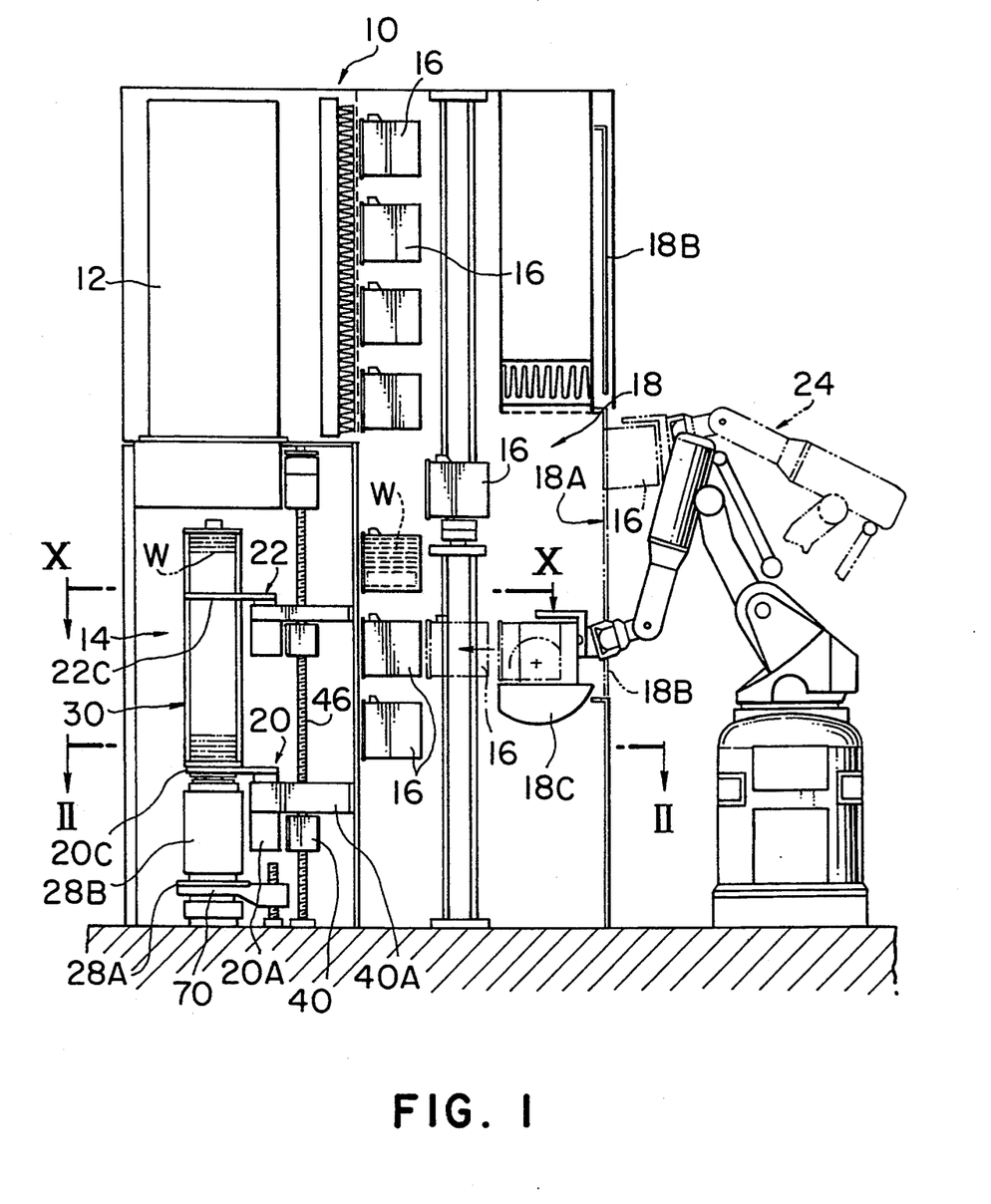
FIG. 1 is a partially broken side view of the general structure of the vertical heat treating device according to this invention.

FIG. 1 is a partially broken diagrammatic side view of the vertical heat treating device according to a first embodiment of this invention. The vertical heat treating device according to this embodiment has the structure of the so-called upper heat type including a reaction furnace in an upper part of the device.

That is, as shown in FIG. 1, the vertical heat treating device 10 includes a transfer chamber 14 below a reaction furnace 12, and a stock chamber 18 provided on the side of the transfer chamber 14 for storing carriers 16 housing objects to be treated in a book shelf-like state.

As will be described later, the transfer chamber 14 includes boat transferring means 20 and wafer transferring means 22. The wafer transferring means 22 transfers objects to be treated, e.g., semiconductor wafers W (hereinafter called wafers) which are stored in the carriers 16 carried to the side of the transfer chamber from the outside by, e.g., a robot 24. This wafer transferring means 22 draws out and transfers the wafers W one by one onto a boat 30 mounted on a heat insulator 28B formed in one-piece with a cap body 28.

In the stock chamber 18 there is provided a carrier housing in the form of a plurality of rows (in the shape of book shelves). An opening 18A is formed in the side of the stock chamber 18 opposed to the robot 24, so that a door 18B is opened to let in and out the carriers 16 by the robot 24. The carriers let into the stock chamber 18 through the opening 18A are placed on a turn table 18C and turned by 90° to be horizontal. The horizontal positioned carriers 16 are opposed to the transfer chamber 14, and wafers W housed in the carriers 16 are transferred onto a boat 30 one by one or by a group onto the boat 30 by a fork 22C as the wafer transferring means 22.

Figure 2:
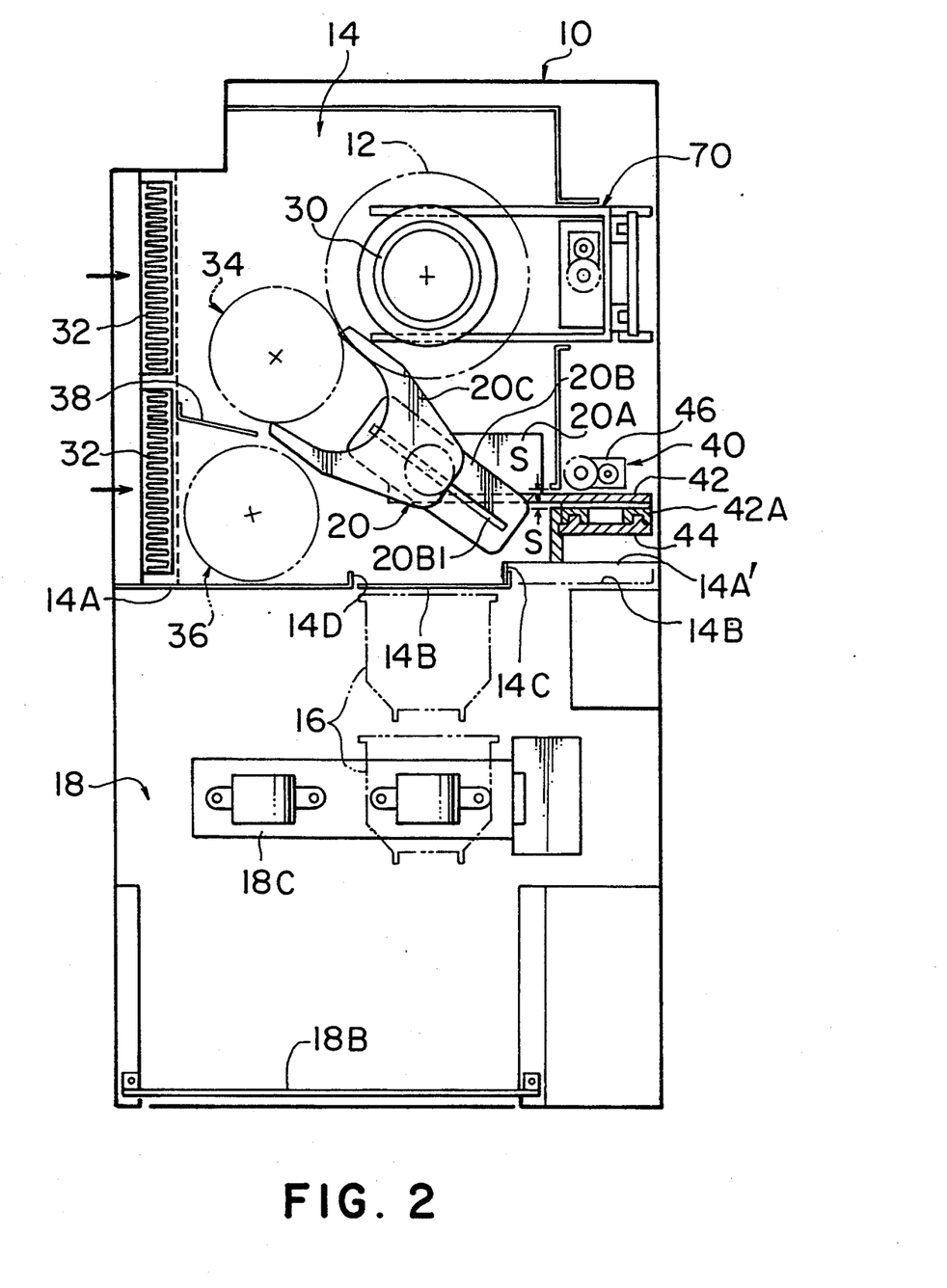
FIG. 2 is a sectional view along the line II—II in FIG. 1.

As shown in FIG. 2, the transfer chamber 14 is a tightly closed space divided by a wall 14A from the stock chamber 18. The transfer chamber 14 has an opening 14D with a door 14B for opening and closing the transfer chamber 14, and the opening 14D is formed at a position where the wafers are transferred from the carriers 16 in the stock chamber 18. The door 14B and a wall 14A' opposed to the door 14B have respective bent portions, and a seal member 14C is provided between the bent portion so that the door 14B is closed with air-tightness secured between the transfer chamber 14 and the stock chamber 18.

A HEPA (high efficiency particulate air-filter) 32 is provided normally to the horizontal direction in an opening in one side of the transfer chamber 14, i.e., in the left wall as viewed in FIG. 2. The HEPA filter 32 is provided in, e.g., two rows along the wall. Through this HEPA filter 32 dry air, clean air or $N_2$ gas as purge gas is drawn to be caused to flow in the direction of the arrows by a suction fan (not shown) connected to the side of the opposed wall.

In the transfer chamber 14 there are provided waiting positions for a treated boat and a boat to be treated.

A first waiting position 34 for a treated boat 30 and a second waiting position 36 for a next boat to be treated are on the upstream of flow of clean air or the purge gas flowing through the HEPA filter, i.e., near the HEPA filter 32. A heat shielding plate 38 is provided between the first and the second waiting positions 34, 36. The first waiting position 34 is nearer to the reaction furnace 12, and the second waiting position 36 is remote from the reaction furnace 12.

The heat shielding plate 38 is made of, e.g., stainless steel sheet, has the proximal end secured to the wall which supports the HEPA filter 32 nearer to the second waiting position 36, and has the extension from the proximal end to the distal end declined to the wall. A declination angle is so set that clean air or the purge gas flowing in through the HEPA filter 32 is not diffracted toward the second waiting position 36.

The boat transferring means 20 and the wafer transferring means 22 are disposed downstream of the first and the second waiting positions 34, 36 as viewed in the direction of flow of the clean air or the purge gas.

The boat transferring means 20 and the wafer transferring means 22 are the same in their driving mechanism except that they respectively have on the forward ends, in accordance with an object to be mounted, a one-boat mounting surface, or a wafer mounting surface (an arm of a fork) which can accommodate at once 5 sheets, for example, of the wafers in a carrier.

Figure 3:
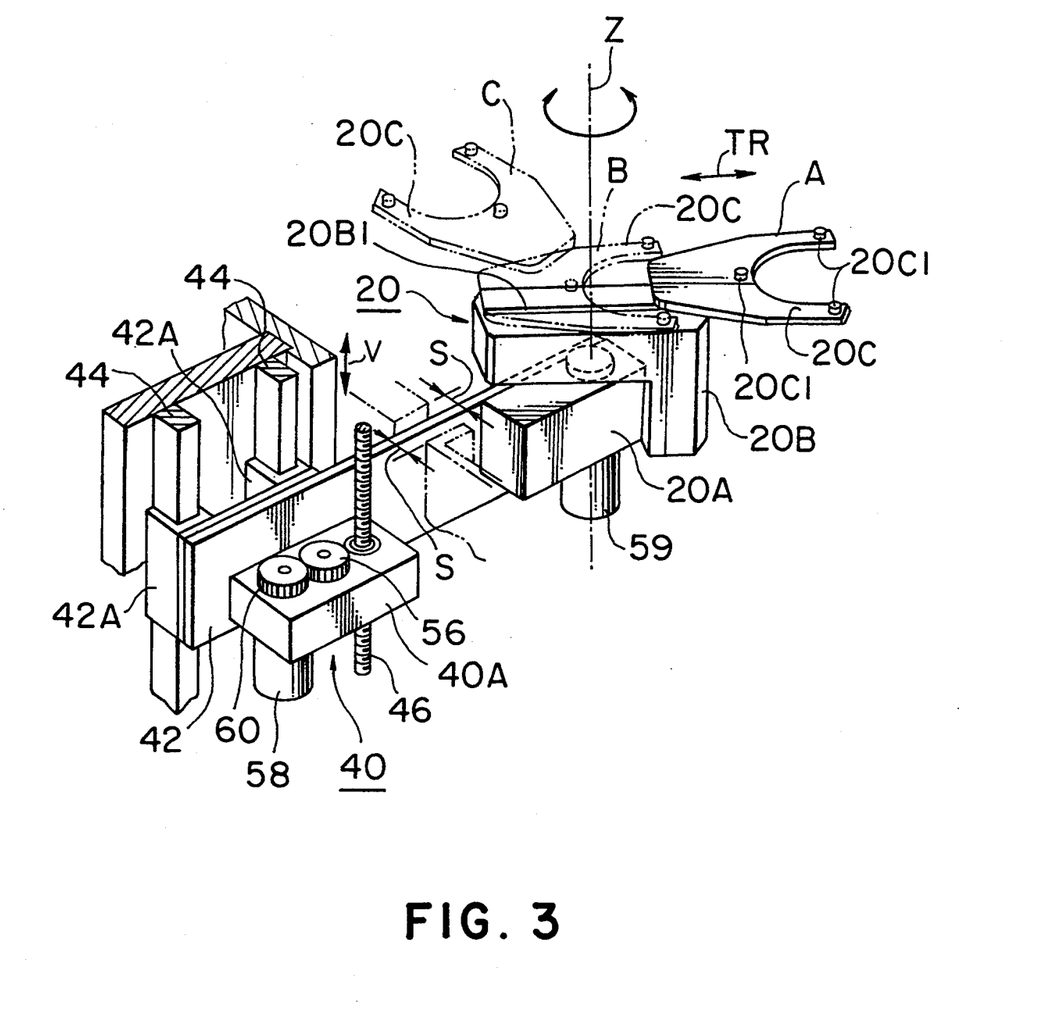
FIG. 3 is a diagrammatic perspective view of the boat transferring means used in the vertical heat treating device of FIG. 1.

As shown in FIG. 3, the boat transferring means 20 includes a base 20A, a rotary drive 20B and a boat mounting arm 20C. The base 20A is secured to a base plate 42 attached to the device body for integrating the base 20A to a lift drive 40 which will be described later. The rotary drive 20B is rotary member secured to an output shaft of rotary drive means 59 disposed on the base 20A. A slit 20B1 is formed in the upper surface of the rotary drive means 59. The boat mounting arm 20C has a two-branched portion on one end, which is inserted in the lower end plate of the boat 30. Pins 20C1, e.g., 3, for mounting the lower end plate of the boat 30 are disposed on the upper surface of the two-branched portion at a set distance.

The boat mounting arm 20C has on the other end the base end which is not branched. To the surface of the base end opposed to the slit 20B1 of the rotary drive 20B is secured an output member of a linear drive means (not shown) disposed in the rotary drive 20B so that the arm 20C can be displaced from the center of the rotation radially along the slit 20B1.

Accordingly as shown in FIG. 3 at R, the rotary drive 20B can be revolved on the rotation center Z. As shown in FIG. 3 at R, the boat mounting arm 20C is displaced from the rotation center Z of the rotary drive 20B radially along the slit 20B1 and can make the so-called retractable motion, whereby the boat transferring means 20 can be revolved and displaced in a two-dimensional plane. In FIG. 3, A indicates the position of the arm 20 stretched radially from the rotation center of the rotary drive 20B, B indicates the position of the retracted arm 20C, and C indicates the position of the arm 20C after the rotary drive 20B has been revolved.

Figure 10:
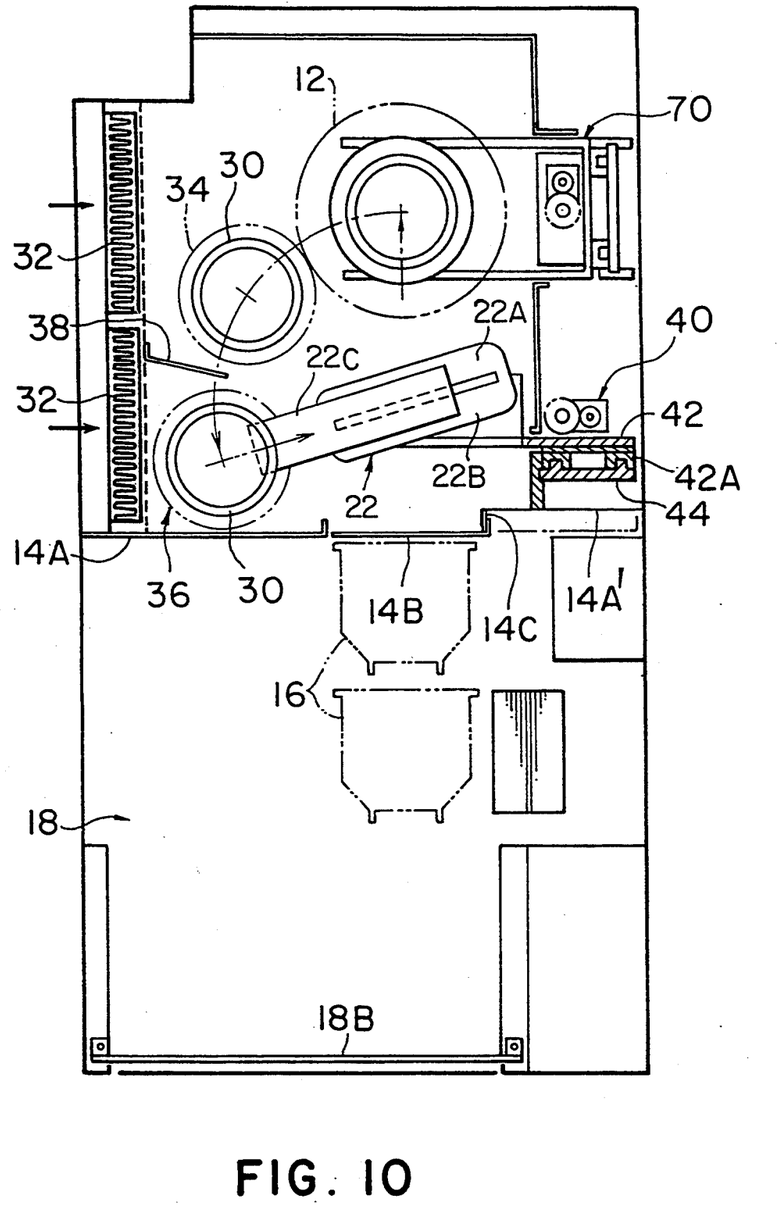
FIG. 10 is a sectional view of the object-to-be-treated means along the line X—X in FIG. 1.

As shown in FIG. 10, the wafer transferring means 22 includes a wafer fork 22C, a base 22S and a rotary drive 22B. The wafer transferring means 22 also make substantially the same operation to transfer and receive the wafers one by one or a group onto and from the wafer boats 30. In this embodiment the boat transferring means 20 and the wafer transferring means 22 are disposed downstream of flow of the clean air or the purge gas flowing in through the HEPA filter 32.

As exemplified in FIGS. 2 and 3, the wall through which the base plate 42 (with the boat and the wafer transferring means 20, 22 mounted thereon) is put has small gaps S thickness-wise with respect to the base plate 42 between the base plate 42 and the wall. This is for minimizing exposure of the drive mechanism of the boat transferring means 20 and the wafer transferring means 22, and for restricting a flow path of the clean air or the purge gas from the HEPA filter 32 so as to make the suction of the clean air or the purge gas flowing from the HEPA filter 32 efficient and to improve removing efficiency of dust from the transferring means 20, 22. In place of the gaps S, a plurality of holes may be punched in the part of the wall.

As shown in FIG. 3, the lift drive 40 is disposed so as to be integrated with the boat transferring means 20 and the wafer transferring means 22 through the base plate at their respective mounting positions.

That is, as shown on the left side of FIG. 3, the lift drive 40 has a bracket 40A with the drive mechanism mounted thereon secured to the base plate 42, a linear guide 42A fixed to the base plate 42 is engaged in a rail 44 disposed on a wall of the device. Thus as indicated by V in FIG. 3, the boat transferring means 20 and the wafer transferring means 22 can be displaced in a direction normal to the above-mentioned two-dimensional plane, the so-called vertical direction (z axis direction).

Figure 4:
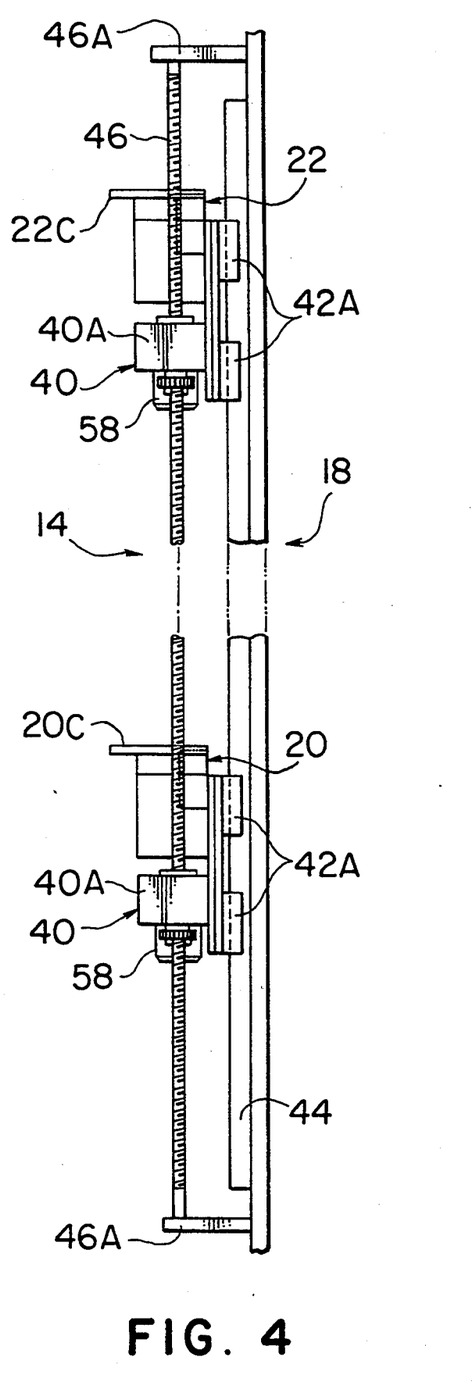
FIG. 4 is a side view of the lift drives for the boat transferring means and the object-to-be-treated transferring means used in the vertical heat treating device of FIG. 1.
Figure 5:
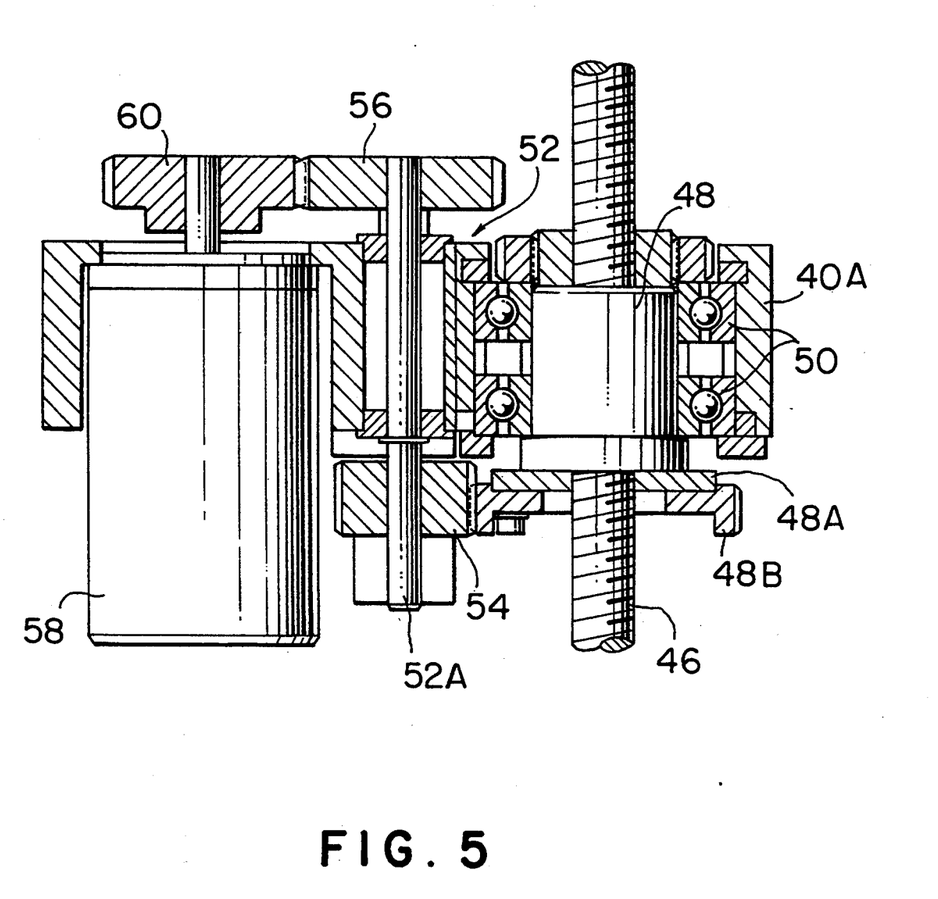
FIG. 5 is a vertical sectional view of the lift drive of FIG. 4.

As shown in FIG. 4, the lift drive 40 is screw-engaged with a stationary screw rod 46 whose extensions are secured by means of brackets 46A respectively on the sides of the ceiling and the bottom plate. As shown in FIG. 5, this screw rod 46 is screw-engaged with a ball nut 48. As apparent in FIGS. 1 and 4, the lift drive 40 is disposed coaxially not only with the boat transferring means 20, but also with the wafer transferring means 22. The lift drive 40 can be driven up and down independently by the transferring means 20, 22. For example, when the boat transferring means 20 is lifted to below the reaction furnace 12 to take out a boat, the wafer transferring means 22 is displaced to yield to the position indicated by the two-dot chain line in FIG. 1 (near the reaction furnace 12) not to interfere with the boat transferring means 20.

As shown in FIG. 5, the ball nut 48 has the inner ring of axially juxtaposed bearings 50 secured to the outer circumference of a cylindrical body and the outer ring of the bearing 50 secured to the bracket 40A. The ball nut 48 includes a gear 48B secured to the flange 48A formed on a part of the cylinder. This gear 48B is in mesh with an output gear 54 mounted on one end of a shaft 52A of a reduction gear mechanism 52.

An input gear 56 is mounted on the other end of the shaft 52A of the reduction mechanism 52 with the output gear 54. The input gear 56 is in mesh with a drive gear 60 mounted on an output shaft of a drive motor 58.

Accordingly rotation of the drive motor 58 is transmitted to the output gear 54 through the drive gear 60 and the shaft 52A of the reduction mechanism 52, and the gear 48B of the ball nut 48 is rotated.

When the ball nut 48 is rotated, the inner ring of the bearing 50 with the ball nut 48 inserted therein is displaced axially along the screw rod 46, but this displacement is transmitted to the outer ring through the balls, and the bracket 40A with the outer ring secured thereto is displaced axially along the screw rod 46. Then the base plate 42 integrated with the bracket 40A can be moved up and down axially along the rail 44A. The above-described reduction mechanism 52 is for transmitting the rotation of the drive motor 58 to the gear 48B of the ball nut 48, and the gear 48B of the ball nut 48 is positioned on the underside of the ball nut 48. Needless to say, the position of the gear 48B is not limited to this arrangement.

The operation of the boat transferring means of the vertical heat treating device according to this invention will be explained below.

In FIGS. 6 to 9, the one-dot chain line arrow indicates the displacement path of the boat transferring means 20.

Figure 6:
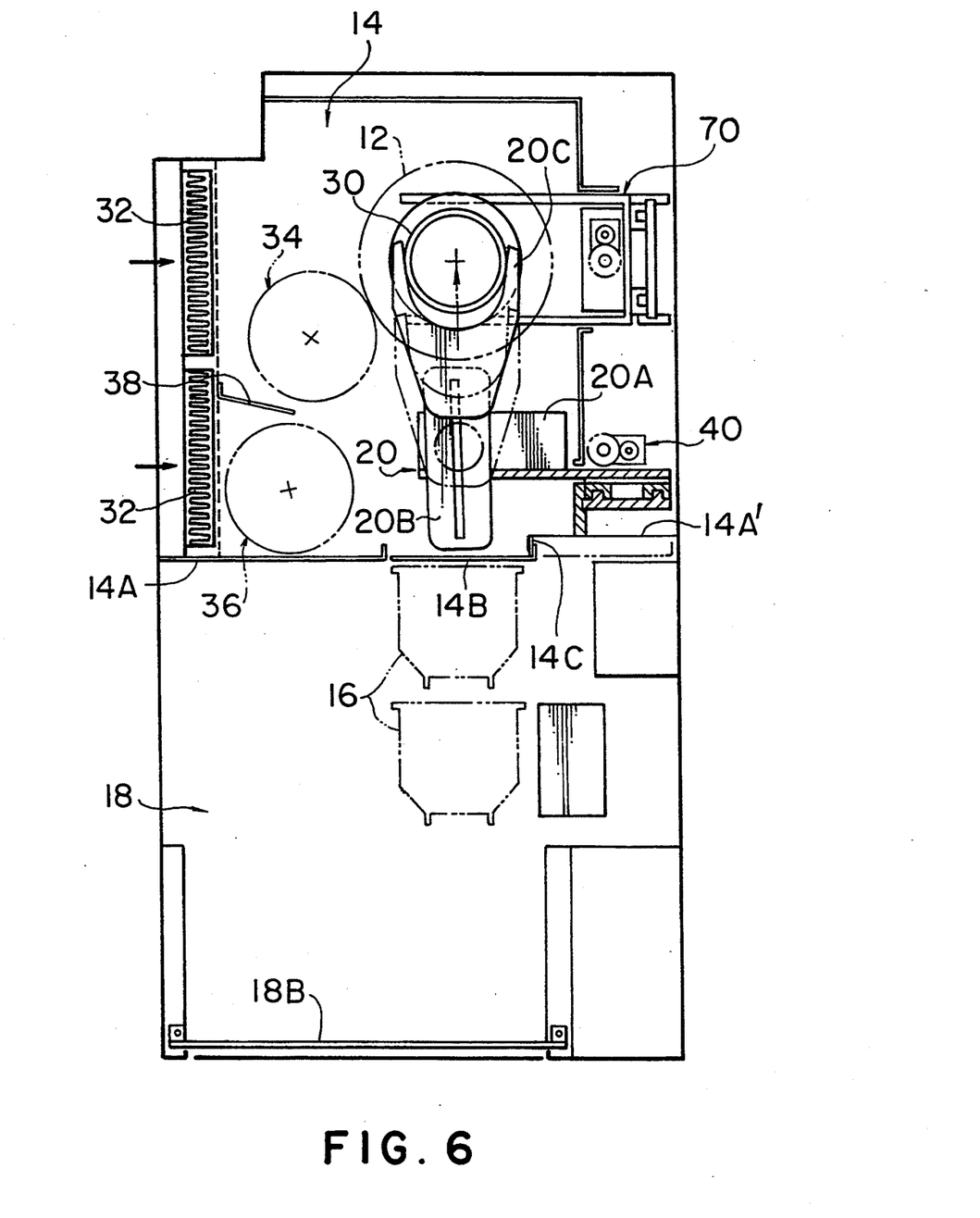
FIG. 6 is a plan view explaining an operation of the boat transferring means of FIG. 3, the boat transferring fork of the boat transferring means being opposed to a lower position of a boat.

In the reaction furnace, when a heat treatment of objects to be treated is over, a boat 30 loaded in the reaction furnace 12 is lowered by the boat elevator 70. At this time, as shown in FIG. 6, the rotary drive 20B is revolved to oppose the boat transferring means 20 to the first waiting position 34 of the boat 30. When the boat 30 has been lowered, the boat mounting arm 20C is extended radially on the rotary drive 20B to insert the two-branched portion below the lower end plate of the boat 30 and lift the boat 30 at the lower end plate.

Figure 7:
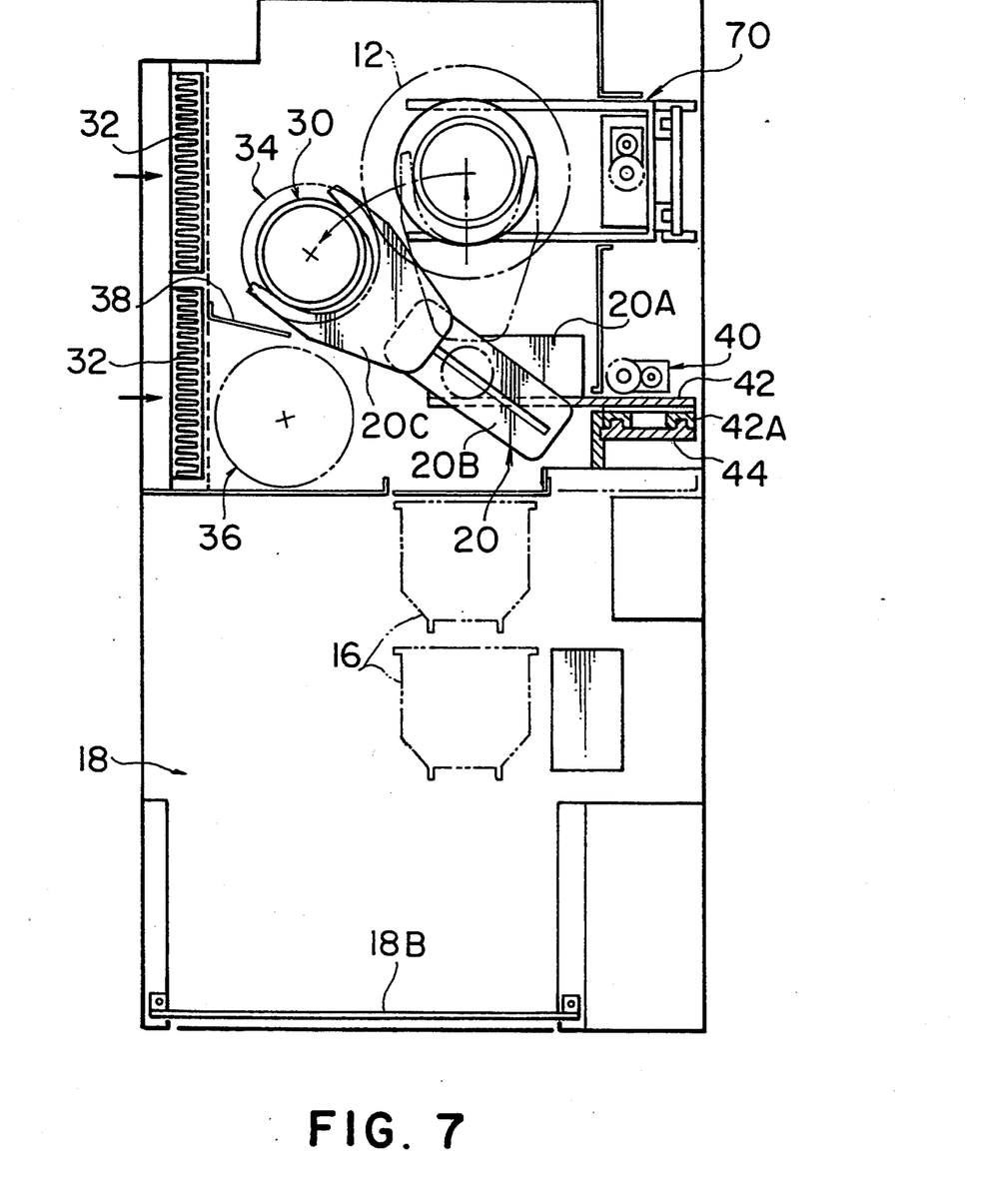
FIG. 7 is a view, similar to FIG. 6, of the boat transferring fork of the boat transferring means opposed to a first waiting position.

When the boat 30 is completely supported at the lower end plate thereof, as shown in FIG. 7, the rotary drive 20B is revolved to oppose the boat transferring means to the first waiting position 34 of the boat 30. At this time, in the lift drive 40, the drive motor 58 is driven to rotate the ball nut 48 down the screw rod 46. Accordingly the boat 30 is placed in position as the boat transferring mean 20 is lowered.

Figure 8:
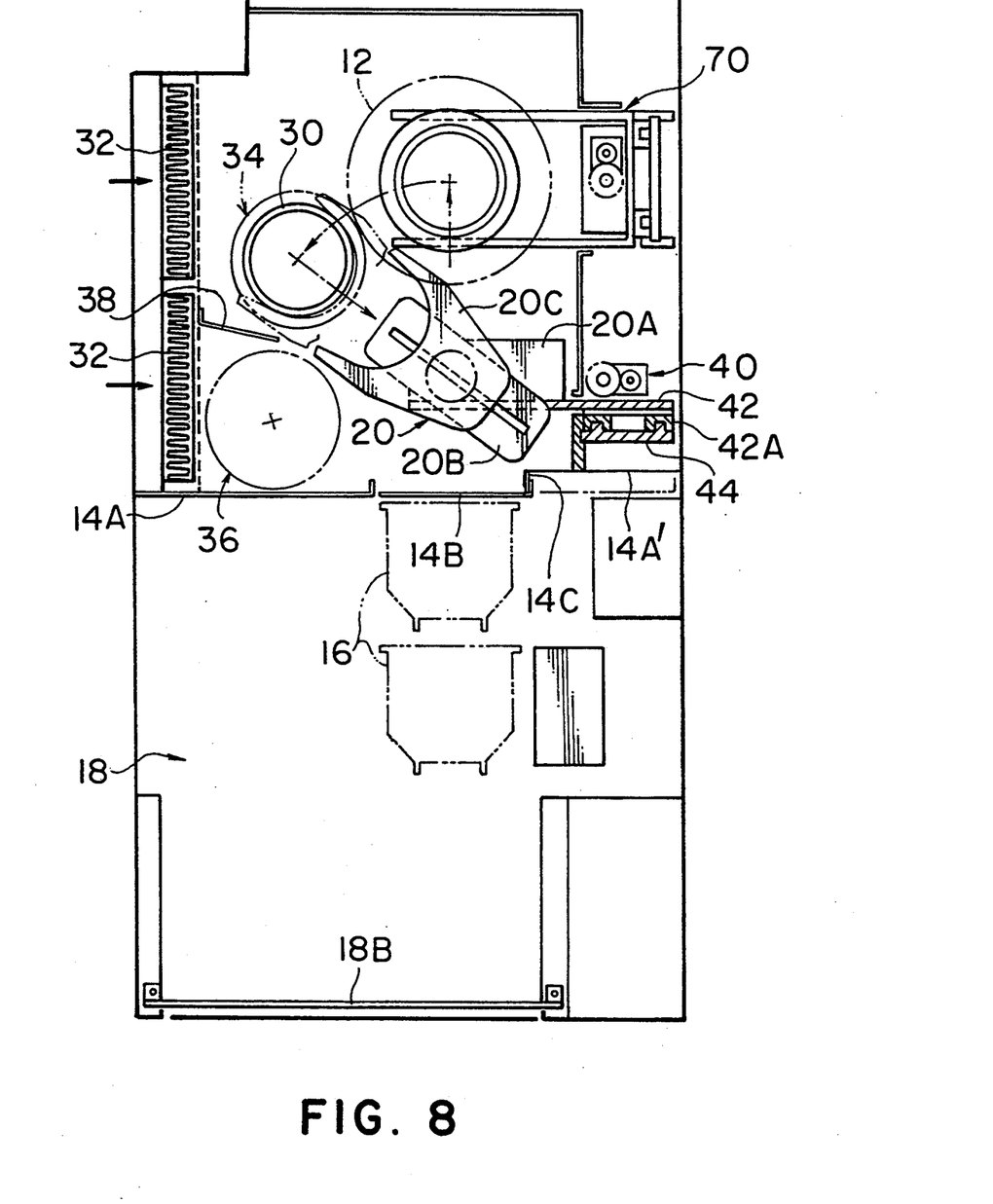
FIG. 8 is a view, similar to FIG. 6, of the boat transferring fork of the boat transferring means radially withdrawn.

The boat transferring means 20, which has positioned the heat-treated boat 30 at the first waiting position 34, retracts the boat mounting ar 20C on the rotary drive 20B to the rotation center as shown in FIG. 8. An amount of the radial retraction of the boat mounting arm 20C is set so that the boat mounting arm 20C can be rotated without interfering with the heat shielding plate 38.

Figure 9:
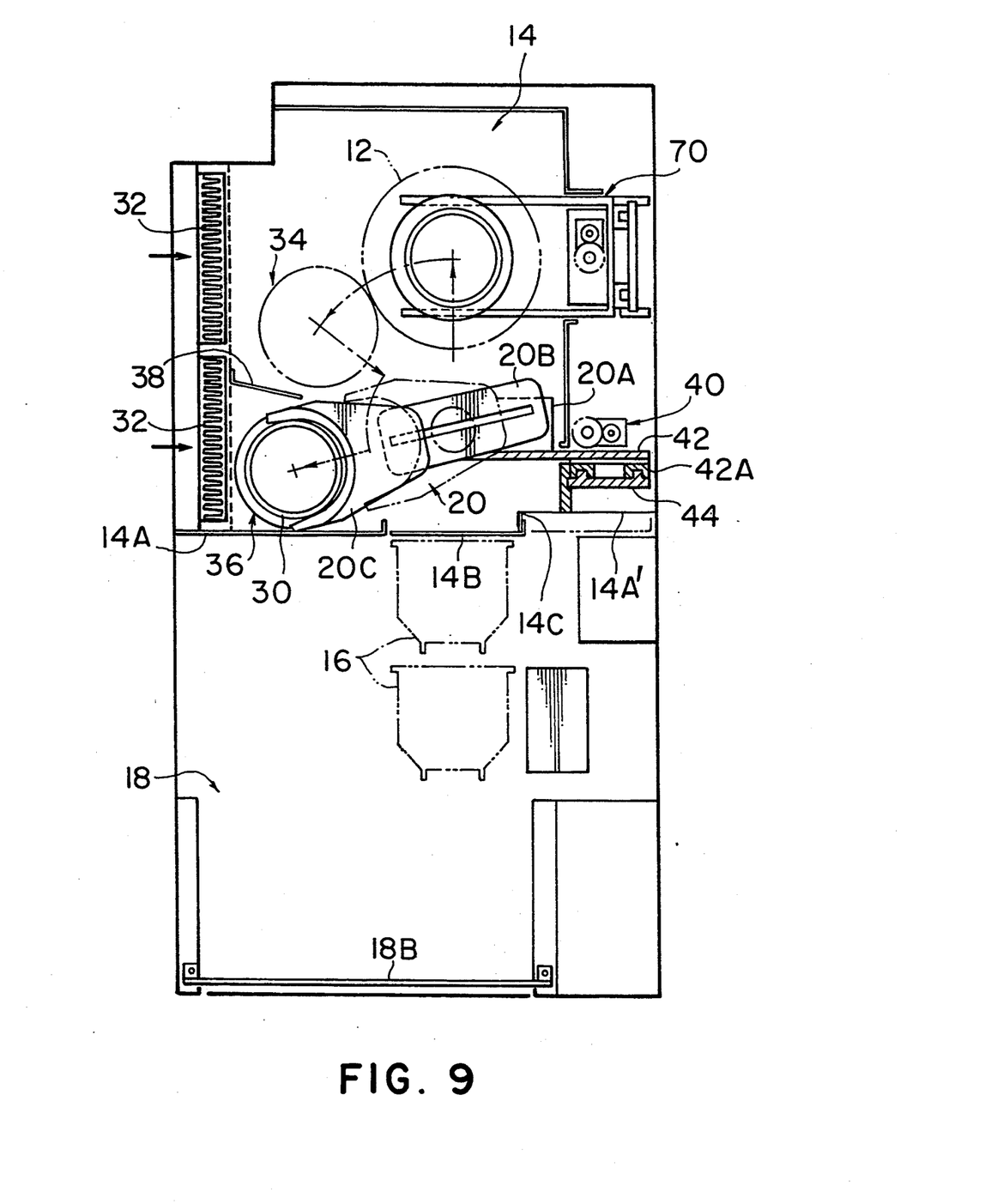
FIG. 9 is a view of the boat transferring fork opposed to a second waiting position.

After the rotary drive 20B is revolved to oppose the second waiting position 36, as shown in FIG. 9, the retracted boat mounting arm 20C is again extended radially and displaced to support a boat 30 set at the first waiting position 36 at the lower end plate.

Although not shown, the boat mounting arm 20C is again retracted, holding the boat 30 at the lower end plate, and then the rotary drive 20B is revolved with the boat 30 lifted from the second waiting position 36. When the boat mounting arm 20C is brought below the reaction furnace 12, the boat mounting arm 20C is extended, and the lift drive 40 is lowered to allow the boat 30 to be mounted on the boat elevator 70.

The transfer of the boats 30 to the reaction furnace 12 has been described above. When wafers are transferred between a boat and a carrier 16, a swing, a radial displacement and upward and downward motions of the wafer mounting means 22 are set in accordance with transfer positions of the wafers on the sides of the boat 30 and of the carrier 16.

As described above, in this embodiment, the transfer chamber 14 housing wafers to be heat treated, and the stock chamber 18 housing carriers which are positioned below the reaction furnace 12 are partitioned, whereby an interior of the transfer chamber 14 can be a relatively small tightly closed space. Accordingly the interior of the transfer chamber 14 can be placed in inert ambient atmosphere of a purge gas in a much shorter period of time compared with placing a space containing the stock chamber 18 in an inert ambient atmosphere with the purge gas, and in addition, the control of the ambient atmosphere is easy. This is especially effective in the case, for example, where a mixed amount of $O_2$ gas which will influence oxidation of wafers to be next treated, due to radiation generated when the reaction furnace 12 is opened, has to be controlled.

Furthermore, since the space for the high-temperature boats to be lifted and lowered through is defined, and the region directly below the reaction furnace, and the region for storing the carriers are definitely divided,- the intrusion of dust from the outside into directly below the reaction furnace, and leakage of reaction gases from the reaction furnace to the outside can be prevented.

Furthermore, according to this invention, the heat shielding plate 38 between the first and the second waiting positions prevents dust from scattering and sticking to wafers on a boat in the second waiting position. That is, even when air flows in the transfer room 14 are made turbulent due to heat from a boat 30 at the first waiting position 34, air flows at the second waiting position are not made turbulent because clean air or purge gas is rectified by the heat shielding plate 38.

In this embodiment, since the screw rod 46 of the lift drive 40 slidably accommodate the boat transferring means 20 and the wafer transferring means 22, the axial length of the screw rod 46 is considerably large. But the screw rod 46 does not rotate but has both axial ends fixed stationary by the bracket 46A, it is possible to preclude unstable behaviors of the respective transfer means 20, 22 due to rotational deflections which may occur if the screw rod 46 is rotated.

According to this embodiment, lift drive 40 respectively provided for the boat transfer means 20 and the wafer transfer means 22 can be driven independently from each other. Accordingly it is possible that when the boat transferring means 20 is lifted to take a boat out of the reaction furnace 12, the wafer transferring means 22 is withdrawn to its retreated position not to interfere with the boat transferring means 20.

Complicated operation is not necessary for the prevention of interference between the transferring means 20, 22, and the simple upward and downward movement alone can practically prevent their interference.

The above-described embodiment has been explained with reference to a two-boat system including two boat-waiting positions for a treated boat and for a boat to be next treated. But the device according to this invention can be readily varied applicably to, e.g., one-boat systems. In this case, the boat transferring means is arranged so as to be positioned at the first or the second waiting position, and either of the clean air feed mechanism or the purge gas feed mechanism is omitted. Thus the basic layout of the device is common with the one-boat and the two-boat systems, and accordingly components can be common.

It is possible that the boat transferring means mounted on the screw rod is replaced with another wafer transferring means in addition to the wafer transferring means 22 so as to increase wafer transfer rates. These variations require no changes to the layout of the transfer chamber 14 and the stock chamber 18 of the heat treating device according to the first embodiment. This also makes it possible to readily make various modifications.

As described above, according to this invention, displacement directions of the boat transferring means are set at a rotary direction and a radial direction from the rotation center, whereby the boat transferring means can be displaced between the boat waiting positions by swing, and radial extension and withdrawal of the boat transferring means. Accordingly spaces for the transfer of the boats and sizes of the device can be decreased. When the boat waiting positions are made nearer, it is possible to provide a heat shielding structure for the hindrance of thermal influence between the boat waiting positions. It is also possible to operate the boat transferring operation without interference with the heat shielding structure.

Since the boat transferring means can be displaced in a two-dimensional plane, a displacement position can be suitably selected in the two-dimensional plane. Accordingly a position with an allowance of radial and angular errors can be indexed, which makes teaching of positioning the boat waiting positions easy.

The boat waiting positions are set upstream of flow of the purge gas or clean air, and the boat transferring means is disposed behind the boat waiting positions, whereby dust generated from the boat transferring means can be recovered before arriving at the surfaces of objects to be treated.

The lift drive for the boat transferring means and the object-to-be-treated transferring means are disposed coaxially with each other. Accordingly a common drive shaft can accommodate both drives without the necessity of an additional drive shaft in a single unit, and the common use of one drive shaft can make the structure simple.

What is claimed is:

1. A vertical heat treating device of a two-boat system including a boat loading/unloading position below a vertical reaction furnace, comprising:
    a vertical reaction furnace above a boat loading/unloading position at which boats are loaded into and unloaded from the reaction furnace;
    a first waiting position where a treated boat waits, and a second waiting position where a boat to be treated next waits;
    one boat transferring means which can be displaced to the first and the second waiting positions, and to the boat loading/unloading position into and from the reaction furnace,
    said boat transferring means being displaceable in a two-dimensional plane including at least rotational displacement and radial displacement from a rotation center of the rotation.

2. The vertical heat treating device according to claim 1, wherein said boat transferring means can be displaced in a direction normal to the two-dimensional plane in addition to the displacements in the two-dimensional plane.

3. A vertical heat treating device of a two-boat system including a boat loading/unloading position below a vertical reaction furnace, comprising:
    a vertical reaction furnace above a boat loading/unloading position at which boats are loaded into and unloaded from the reaction furnace;
    a first waiting position where a treated boat waits, and a second waiting position where a boat to be treated next waits;
    one boat transferring means which can be displaced to the first and the second waiting positions, and to the boat loading/unloading position into and from the reaction furnace,
    the first and the second waiting positions being provided upstream of a flow of clean air or purge gas, and said boat transferring means being disposed downstream of the first and the second waiting positions, with respect to the flow of clean air or purge gas.

4. The vertical heat treating device according to claim 3, wherein said first waiting position is provided nearer to the boat loading/unloading position than said second waiting position, and a heat shielding body is disposed between the first and the second waiting positions.

5. A vertical heat treating device of a two-boat system including a boat loading/unloading position below a vertical reaction furnace, comprising:
    a vertical reaction furnace above a boat loading/unloading position at which boats are loaded into and unloaded from the reaction furnace;
    a first waiting position where a treated boat waits, and a second waiting position where a boat to be treated next waits;
    one boat transferring means which can be displaced to the first and the second waiting positions, and to the boat loading/unloading position into and from the reaction furnace;
    object-to-be-treated transferring means for mounting and dismounting objects to be treated on and from the boats; and
    respective lift drives for the boat transferring means and the object-to-be-treated transferring means disposed coaxially with each other, wherein the lift drives may be driven independently from each other.

6. The vertical heat treating device according to claim 1, wherein said first waiting position is provided nearer to the boat loading/unloading position than said second waiting position, and a heat shielding body is disposed between the first and the second waiting positions.

7. The vertical heat treating device according to claim 5, wherein said first waiting position is provided nearer to the boat loading/unloading position than said second waiting position, and a heat shielding body is disposed between the first and the second waiting positions.

8. The vertical heat treating device according to claim 3, wherein said boat transferring means can be displaced in a two-dimensional plane including at least rotational displacement and radial displacement from a rotation center of the rotation, and said boat transferring means can be further displaced in a direction normal to the two-dimensional plane.

9. The vertical heat treating device according to claim 5, wherein said boat transferring means can be displaced in a two-dimensional plane including at least rotational displacement and radial displacement from a rotation center of the rotation, and said boat transferring means can be further displaced in a direction normal to the two-dimensional plane.

* * * * *